US009168614B2

(12) United States Patent
Schmidt et al.

(10) Patent No.: US 9,168,614 B2
(45) Date of Patent: Oct. 27, 2015

(54) METHOD OF GENERATING HIGH QUALITY HOLE, RECESS OR WELL IN SUBSTRATE

(71) Applicant: ASAHI GLASS CO., LTD., Chiyoda-ku (JP)

(72) Inventors: Christian Schmidt, Engelberg (CH); Leander Dittmann, Lausanne (CH); Adrien Chaize, Hauterive (CH); Svend Hoyer, Chavannes-pres-Renens (CH)

(73) Assignee: ASAHI GLASS CO., LTD., Chiyoda-ku (JP)

( * ) Notice: Subject to any disclaimer, the term of this patent is extended or adjusted under 35 U.S.C. 154(b) by 0 days.

(21) Appl. No.: 13/967,689

(22) Filed: Aug. 15, 2013

(65) Prior Publication Data

US 2013/0330506 A1    Dec. 12, 2013

Related U.S. Application Data

(63) Continuation of application No. PCT/EP2012/002939, filed on Jul. 12, 2012.

(30) Foreign Application Priority Data

Aug. 31, 2011    (EP) ..................... 11007083

(51) Int. Cl.
| | |
|---|---|
| *B23K 26/38* | (2014.01) |
| *B23K 26/40* | (2014.01) |
| *B26F 1/28* | (2006.01) |
| *H03K 3/537* | (2006.01) |
| *B23K 26/06* | (2014.01) |
| *B23K 26/14* | (2014.01) |
| *B23K 26/18* | (2006.01) |
| *B23K 26/30* | (2014.01) |
| *C03C 23/00* | (2006.01) |
| *H01L 31/049* | (2014.01) |

(52) U.S. Cl.
CPC ........... *B23K 26/381* (2013.01); *B23K 26/0661* (2013.01); *B23K 26/1423* (2013.01); *B23K 26/1429* (2013.01); *B23K 26/18* (2013.01); *B23K 26/385* (2013.01); *B23K 26/408* (2013.01); *B23K 26/4065* (2013.01); *B23K 26/4075* (2013.01); *B23K 26/422* (2013.01); *B26F 1/28* (2013.01); *C03C 23/0025* (2013.01); *H01L 31/049* (2013.01); *H03K 3/537* (2013.01); *Y10T 428/24273* (2015.01)

(58) Field of Classification Search
CPC .. B23K 26/365; B23K 26/381; B23K 26/386; B23K 26/388; B23K 26/1423; B23K 26/18; B23K 26/0661; B26F 1/28; H03K 3/537
USPC .................................. 264/400, 449
See application file for complete search history.

(56) References Cited

U.S. PATENT DOCUMENTS

| | | | |
|---|---|---|---|
| 5,672,760 A * | 9/1997 | Burns et al. ............... | 564/440 |
| 6,255,621 B1 * | 7/2001 | Lundquist et al. ....... | 219/121.72 |
| 2004/0140299 A1 | 7/2004 | Arai et al. | |

FOREIGN PATENT DOCUMENTS

| | | |
|---|---|---|
| EP | 1 905 532 A1 | 4/2008 |
| WO | 2005/097439 A2 | 10/2005 |
| WO | 2009/059786 A1 | 5/2009 |
| WO | 2010/063462 A1 | 6/2010 |
| WO | 2011/038788 A1 | 4/2011 |

OTHER PUBLICATIONS

U.S. Appl. No. 13/967,736, filed Aug. 15, 2013, Schmidt, et al.
International Search Report mailed on Nov. 2, 2012, issued for International Application No. PCT/EP2012/002939, filed Jul. 12, 2012 (English).
International Written Opinion mailed on Nov. 2, 2012, issued for International Application No. PCT/EP2012/002939, filed on Jul. 12, 2012 (English).

* cited by examiner

*Primary Examiner* — Matthew Daniels
(74) *Attorney, Agent, or Firm* — Oblon, McClelland, Maier & Neustadt, L.L.P.

(57) ABSTRACT

A method of generating a hole or well in an electrically insulating or semiconducting substrate, a hole or well in a substrate generated by this method, and an array of holes or wells in a substrate generated by the method.

14 Claims, 8 Drawing Sheets

METHOD OF GENERATING HIGH QUALITY HOLE, RECESS OR WELL IN SUBSTRATE

CROSS-REFERENCE TO RELATED APPLICATION

This application is a continuation application filed under 35 U.S.C. 111(a) claiming the benefit under 35 U.S.C. 120 and 365(c) of PCT International Application No. PCT/EP2012/002939 filed on Jul. 12, 2012, which is based upon and claims the benefit of priority of Europe Priority Application No. 11007083.6 filed on Aug. 31, 2011, the entire contents of which are hereby incorporated by reference.

BACKGROUND OF THE INVENTION

1. Field of the Invention

The present invention relates to a method of generating a hole or well in an electrically insulating or semiconducting substrate, and to a hole or well in a substrate generated by this method. The invention also relates to an array of holes or wells in a substrate generated by the method.

2. Description of the Related Art

WO 2005/097439 and WO 2009/059786 disclose methods of generating structures in substrates using the application of voltages to a substrate. The holes of these earlier applications, when present in arrays, typically require large distances (typically >1 mm) between adjacent holes to avoid flashovers during production of arrays without insulating layers. WO 2011/038788 and WO 2010/063462 disclose methods of generating structures in substrates using the application of voltages to a substrate which allows the fabrication of arrays of holes with small pitch (typically <1 mm). These methods are sometimes hampered by a destruction of the substrate surface due to the laser spot required for positioning the process location, or by a contamination of the surface due to incomplete ejection of material or redeposition on the surface around the holes generated.

Accordingly there is a need in the art to provide for improved methods allowing the generation of high quality holes and dense arrays thereof in substrates as well as a significant improvement of surface quality and controllability of hole parameters.

SUMMARY OF THE INVENTION

It was therefore an object of the present invention to provide for a method for producing holes with a better controllability of the shape of the holes and the surface quality at and around the holes. It was also an object of the present invention to provide for such a method which is easy to perform and which can be adapted to mass production of such perforated substrates.

According to an embodiment, there is provided a method of generating a hole, recess or well in a substrate, the method including a) providing a substrate which is electrically insulating or semiconducting at room temperature, and placing it between at least two electrodes connected to a user-controlled voltage supply;

b) melting substrate material in a region of the substrate where the hole, recess or well is to be generated by heating the region using a laser beam, preferably a focused laser beam and, optionally, an AC voltage applied to the substrate via the electrodes; and c) applying, by means of the user-controlled voltage supply, and the electrodes, a voltage of a user-defined magnitude across the region of the substrate, the voltage being sufficient to give rise to an increase in electrical current through the substrate or the region, thereby applying a defined amount of electrical energy to the substrate, and dissipating it from the substrate, wherein the substrate is sandwiched between a first and second modulation layer, the first and second modulation layer being located on opposite sides of the substrate, the first modulation layer being located on a side of the substrate which, in step b), is exposed to the laser beam, preferably the focused laser beam, the first modulation layer allowing to define the size, preferably the cross-section, of the region where the hole, recess or well is to be generated, allowing to avoid surface contamination and/or redeposition of molten substrate material, and allowing to shield substrate surface from heat, the second modulation layer being located on a side opposite of the side on which the first modulation layer is located, and the second modulation layer allowing to avoid surface contamination and/or redeposition of molten substrate material and allowing to shield substrate surface from heat.

According to another embodiment, there is provided a hole, recess, well or an array of holes, recesses or wells, produced by the above method.

Note that also arbitrary combinations of the above-described elements, and any changes of expressions in the present invention, made among methods, devices, systems, recording media, computer programs and so forth, are valid as embodiments of the present invention.

BRIEF DESCRIPTION OF THE DRAWINGS

Other objects, features and advantages of the present invention will become more apparent from the following detailed description when read in conjunction with the accompanying drawings.

DETAILED DESCRIPTION OF THE PREFERRED EMBODIMENTS

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

The present inventors have surprisingly found that the quality of holes, recesses or wells generated in substrates can be astonishingly improved by using two modulation layers located on opposite sides of the substrate.

The process by which holes are introduced into substrates are effectively already described in WO 2005/097439 and WO 2009/059786. The application of a voltage to the substrate leads to a controlled dielectric breakdown across the substrate, which, in turn, leads to an ejection of material from the substrate.

According to the present invention, the use of modulation layers allows to improve the quality of the holes thus generated by such control dielectric breakdown.

Typically, the means for heating the substrate and the modulation layer(s) is a laser. In one embodiment, the laser heats the modulation layer. The selection of a specific laser depends on the substrate and modulation layer material. Examples are $CO_2$-lasers having a wavelength of 10.6 μm or 9.3 μm. Other preferred lasers are lasers having a wavelength in the range of from 800 nm to 1300 nm.

It should be noted that the laser wavelength is also chosen such that it is absorbed by the modulation layer and heats it, and/or it is absorbed by the substrate which heats the modulation layer. This allows a heating of the modulation layer(s). Absorption may be 100% or less, i.e. substantially all of fractions of the incident radiation is absorbed by the substrate or the modulation layer(s) or both.

As used herein, the term "is at least partially absorbed" is meant to refer to any scenario wherein the substrate and/or the modulation layer(s) absorb 0.1% to 100% of the incident radiation.

As used herein, the term "modulation layer" refers to a layer that is attached to the substrate, preferably in a side-by-side-manner, such that the modulation layer(s) and the substrate are adjacent and opposite to each other. In this arrangement the region in which a hole is to be generated in the substrate is also sometimes referred to as a "substrate region", and the corresponding region in the modulation layer lying opposite such substrate region is also referred to as a "modulating region". Effectively, such modulating region lies on top of (for the first modulation layer) or underneath (for the second modulation layer) the substrate region.

In one embodiment, the modulating region and the substrate region are of approximately the same size, preferably the same cross-section.

In another embodiment, the modulating region is 5% or more, such as 10%, 15%, 20%, 25%, 30%, . . . , 100%, larger in cross-section than the substrate region.

Figure 1:
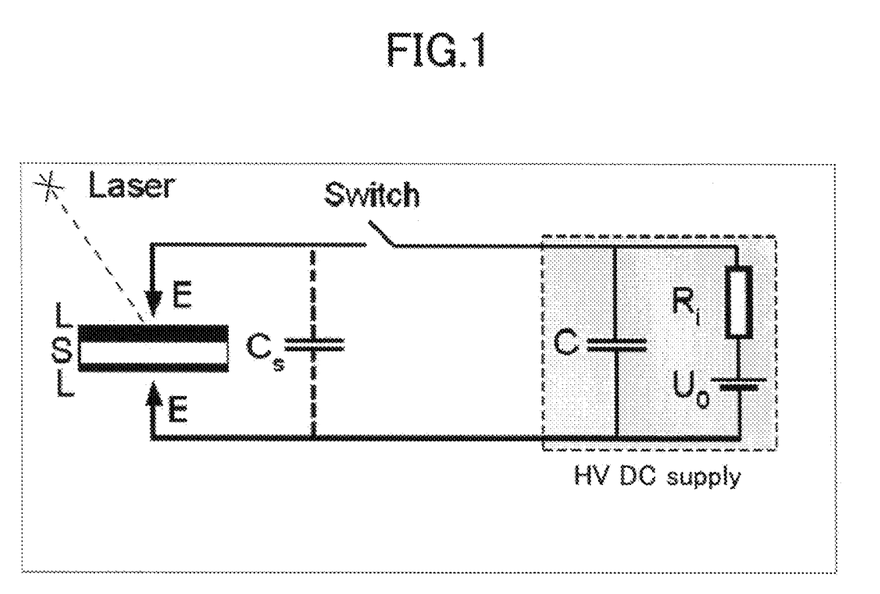
FIG. 1 is a view illustrating an example of a basic experimental setup.

An embodiment of a basic setup used for generating a structure in a substrate is shown in FIG. 1.

A substrate S to be processed is placed between two electrodes E and a volume of material of the substrate is molten by a heat source. This heat source can be e.g. a laser or high frequency source capable of directly heating (causing dielectric losses in the substrate) or indirectly heating (by the electric arc) the substrate S or a combination of such heat sources. The molten material is removed by applying a voltage across the substrate S using the two electrodes E connected to a voltage source (HV DC supply) and placed at a distance from and on opposite sides of the substrate S.

If the heat source is a laser, its wavelength must be adapted to the substrate properties as e.g. absorption, transmittance, reflectance, thickness. In one embodiment the laser emits light which, upon irradiation on the substrate, is capable of penetrating the substrate material and which light, upon irradiation on the substrate, is not being fully absorbed or reflected at a surface of the substrate, but penetrates also in substrate regions underneath the surface.

In another embodiment, the laser emits light which, upon irradiation on the substrate, is fully or nearly fully (>90%) absorbed at a substrate surface, and wherein the volume of material is heated by internal heat conduction. In either case more radiation is absorbed on the surface compared to regions underneath the surface (Lambert-Beer's law). With respect to the laser it is specifically the focal spot size, the power and application time that determines a sufficient through heating of the material and the size of the hole formed. Due to the wavelength (which is adapted to the material to be processed), the beam quality of the laser and the properties of the focussing optics, the achievable minimal spot size of the laser beam is limited. If the spot size has a larger diameter than the hole to be drilled, more material on the substrate surface is heated which is not or not fully removed upon voltage application. This causes an excess heat on the substrate surface leading to reduced quality as e.g. surface damage and residual tensions inside the substrate. Furthermore, ejected material may be re-deposited on the substrate surface around the holes which causes considerable surface contamination and introduces high residual tensions.

In accordance with the embodiments of the present invention, a modulation layer, preferably a laser beam modulation layer is attached to two sides of the substrate surface in order to modulate and restrict laser access to the substrate surface so as to reduce excess heat and surface damage and to improve the quality of the surface surrounding the hole. Material properties and thickness of the modulation layer(s) depend on substrate material properties, thickness, laser application time and laser power.

In one embodiment the modulation layer modulates or restricts the amount of laser light accessing the substrate surface in such a way that a defined volume of modulation layer is locally removed from the substrate so as to expose a defined region of the substrate surface to the laser light, the region having a defined size, preferably a defined cross-section. This local removal of the modulation layer is preferably achieved by the energy applied during hole drilling process itself, e.g. by the laser beam.

Figure 2:
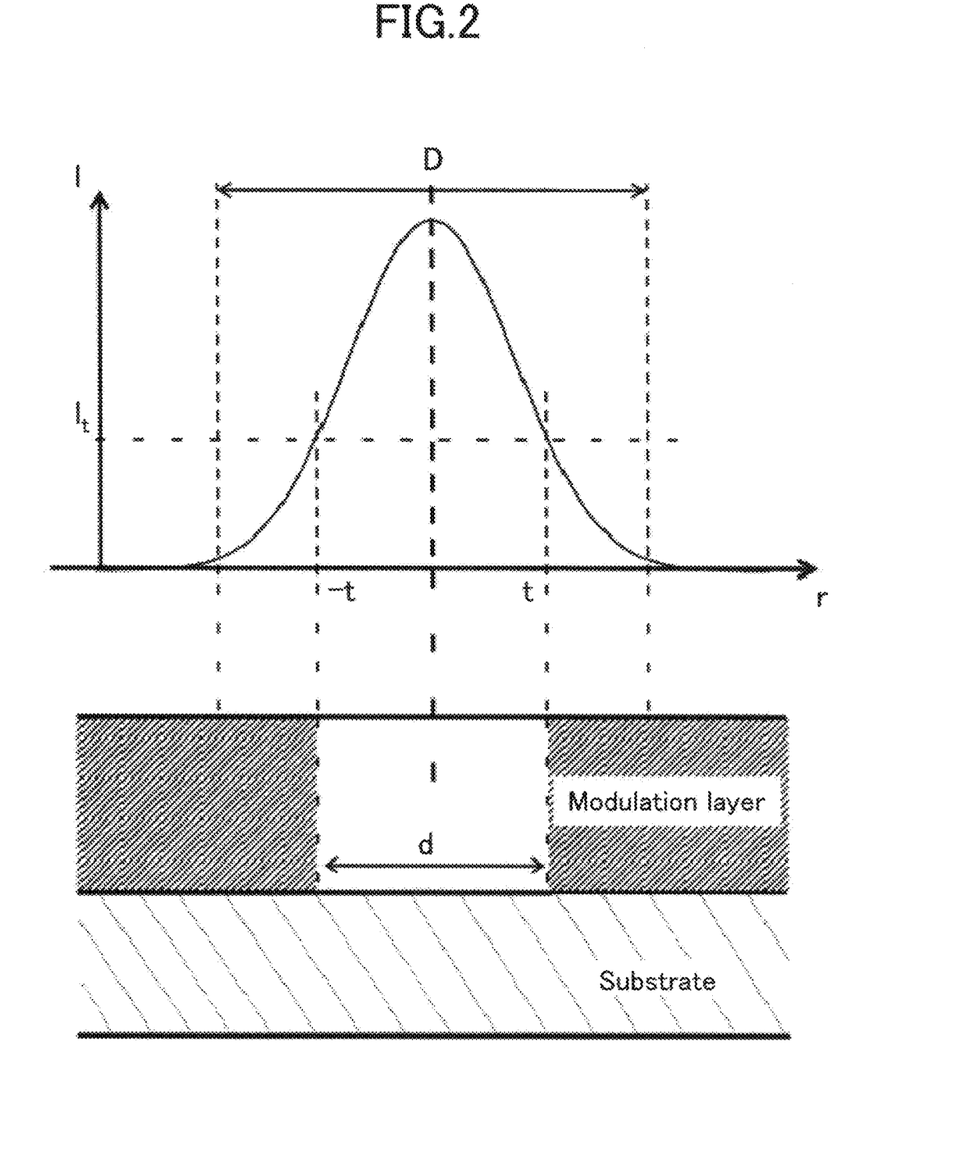
FIG. 2 illustrates a Gaussian intensity profile I(r) of a laser beam with a spot size D.

Assuming a nearly Gaussian beam profile the intensity of the laser light and therefore the energy density irradiated onto the material is highest in the center of the beam. It is therefore advantageous to use materials for the modulation layer with a phase transition between solid and liquid/gaseous state or more generally a transformation/decomposition threshold at a certain temperature or in general at a certain energy or energy density. When the laser beam is applied to the modulation layer the phase transition or decomposition will be reached in the center of the laser spot thus leading to a local material removal at this position but not at the circumference or outer regions of the laser spot where energy is insufficient to overcome the transition threshold (FIG. 2). This local removal of material creates an opening in the modulation layer which is smaller than the laser spot size and therefore restricts laser access to the substrate material underneath. Therefore the irradiated (and subsequently molten) region on the substrate surface is reduced, resulting in less or no excess heat and therefore less surface damage and residual tensions which allows e.g. for a smaller pitch.

If the modulation layer material does not obey a sharp transition or decomposition or is in general not thermally stable upon laser irradiation the amount of removed modulation layer material and thus the size of irradiated substrate surface can be tuned by adapting the thickness of the modulation layer to the duration and power of the laser pulse. For a given duration of the laser pulse more energy is dissipated and, consequently, the material removal rate is higher where the laser intensity is higher (typically in the center of the spot). The application of a laser pulse onto the modulation layer material therefore creates a recess in the modulation layer which resembles the intensity profile of the laser beam. Upon increasing the thickness of the modulation layer the size of the opening created in the modulation layer and thus the size of the exposed substrate surface region can be decreased (FIG. 3A to FIG. 3C) leading to less excess heat and surface damage.

A modulation layer each is attached to each side of the substrate. Such a sandwich structure, i.e. a layer on each side is preferred to avoid surface contamination due to ejected material that may be re-deposited in terms of e.g. filaments or spheres on both substrate surfaces around the holes. Without wishing to be bound by any theory, the inventors believe that, when a modulation layer is used, the ejected material cannot come to rest and stick to the substrate surface but is deposited on the layer or merges with it, or the presence of the modulation layer changes the way material is being ejected (due to altered geometry) so that no filaments are formed that stick to the hole entrance after the hole is drilled. Upon removing the modulation layer from the substrate after hole drilling all ejected material is removed together with the layer providing for a clean contamination-free substrate surface.

Material properties and/or thickness of the modulation layer(s) may be different on either side. For instance, the thickness can be reduced on the side where no laser beam is applied since there is no need for a restriction or modulation of the laser beam and the layer primarily serves to avoid material re-deposition and shielding/modulating heat from an electric arc formed during step b) or c). The material properties may differ on both sides because the opening in the modulation layer on the side where no laser is applied must be created by a DC high voltage discharge which opens the hole in the substrate or optionally by an AC high frequency arc forming between the electrodes. In both cases the material properties of then modulation layer must allow for its local removal at the position of the hole which is mainly achieved by thermal effects of the electric arc (either AC or DC or both).

The modulation layer can be attached to the substrate material in various ways, e.g. using a tape that sticks by itself like Scotch® Magic Tape, by adhesion due to a thin film of liquid as e.g. water or ethanol between substrate and layer, or by spin coating or spraying a layer of material on the substrate surface, or by electrostatic forces between substrate and layer, or every other technique that ensures a homogeneous attachment of the layer to the substrate without distortions like enclosed air bubbles or thickness variations that counteract a reliable hole drilling process.

It is advantageous to use modulation layer material or methods to attach them to the substrate that allow for easy detachment after holes were drilled. The layer can be detached e.g. mechanically by peeling it off or scratching, thermal dissociation as e.g. burning or ashing, or plasma ashing, chemical dissolution.

Materials that have been used are e.g. Scotch® Magic Tape, selfsealing insulation tape (3M), PDMS, wafer dicing tape, various polymers like PET foil, polyimide, resins, and composite systems. For 170 μm thick glass substrates a modulation layer thickness of 20 μm to 100 μm was successfully used without the need of altering the process parameters to drill holes. For thicker modulation layers it was necessary to increase the laser application time or laser power in order to supply enough energy to locally remove the modulation layer.

In the following reference is made to the figures which are given as exemplary embodiments to illustrate, not to limit the present invention.

FIG. 1 is a view illustrating an example of a basic experimental setup.

The substrate S with a modulation layer L attached on both sides is placed between two electrodes E (electrode-substrate gap distances 0.1-5 mm). The electrodes E are connected to a high voltage DC power supply (HV DC supply) including a capacitor C which was charged by a high voltage source ($R_i$ being the DC impedance of the actual voltage source). For thin substrates an additional parasitic capacitance $C_s$ could form across the substrate S. The process relevant source impedance is defined by reactive or resistive elements placed in the circuit (not shown) which may be e.g. a resistor or an inductor or a combination thereof, also optionally including a capacitance. The substrate S is locally heated by focused laser radiation and optionally as additional heat source a high frequency high voltage (not shown) is applied to the electrodes. Upon melting of the substrate material a high DC voltage from the HV DC power supply is applied between the electrodes E driving the molten material out of the substrate S. To provide immediately the full operating voltage to the electrodes the capacitor C is charged and, upon reaching the voltage application time, connected to the electrodes via a fast switch such as a triggered spark gap.

FIG. 2 illustrates a Gaussian intensity profile I(r) of a laser beam with a spot size D, defined as $I(D/2)/I(0)=1/e^n$ where n equals 1 or 2. When this beam is directed onto a modulation layer for a given time period an amount of energy is dissipated in the modulation layer which is proportional to the intensity of the laser beam. In regions of radial distances r<t from the center of the beam where intensity is larger than a certain threshold intensity $I_t$ this energy is sufficient to overcome e.g. the evaporation temperature or a decomposition threshold so that the modulation layer material will be removed. The orifice of diameter d=2t created in that way in the layer material allows only a fraction of the laser beam to pass through and access the substrate material underneath the modulation layer. The surface area of the substrate which is shined on by the laser beam and consequently affected by laser heating is therefore restricted to diameter of d.

Figure 3A:
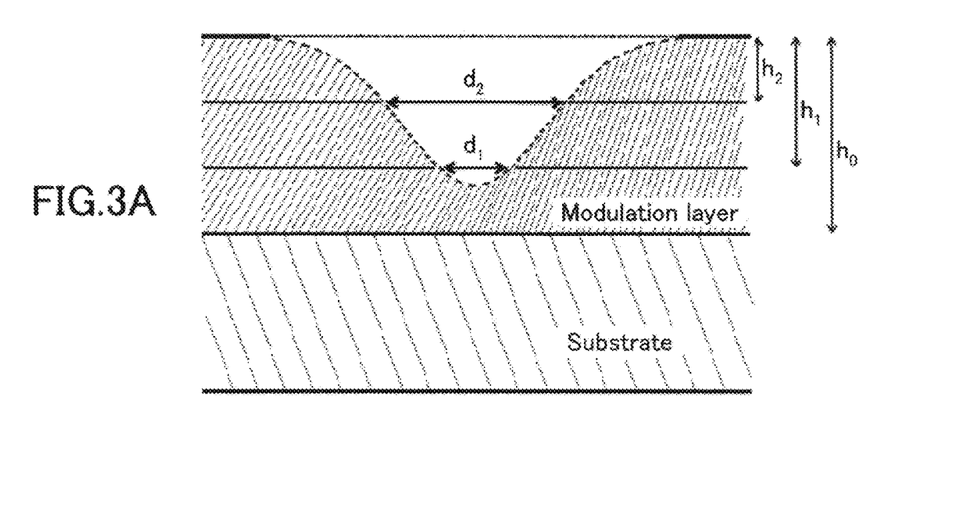
FIG. 3A to FIG. 3C are views illustrating a recess formed in a layer.
Figure 3B:
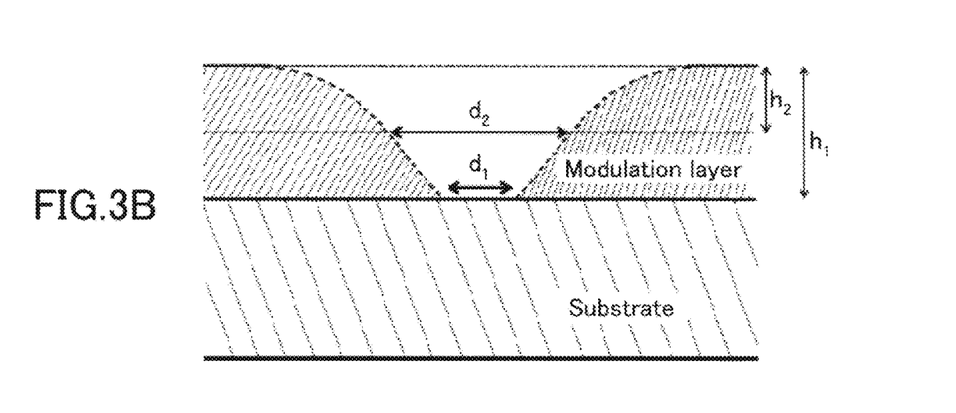
Figure 3C:
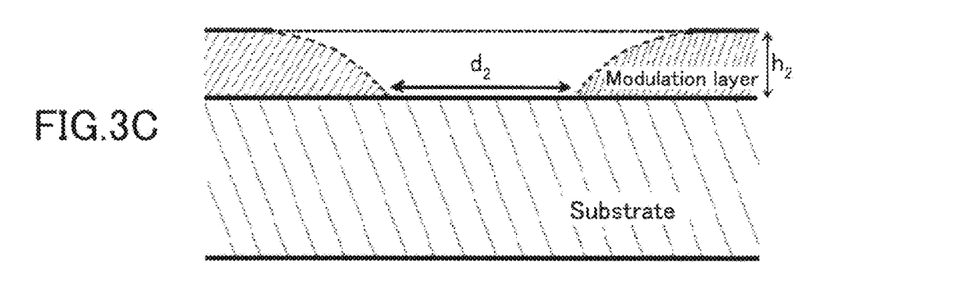

If the material properties of the layer do not allow for a sharp transition from solid/liquid to evaporation/decomposition as described in FIG. 2 but instead the material of the modulation layer is gradually removed over the entire area of the applied laser spot, the diameter d of the orifice formed in the modulation layer can be defined by the thickness of the modulation layer. In FIG. 3A, the laser beam applied to the modulation layer of thickness $h_0$ creates a recess in the layer but no opening to the substrate underneath is created. In FIG. 3B, a reduced thickness $h_1$ of the modulation layer allows the created recess (same laser conditions) to approach the substrate underneath resulting in an orifice of diameter $d_1$ in the modulation layer. In FIG. 3C, reducing the layer thickness further to $h_2$ leads to a bigger orifice of diameter $d_2$ and a larger substrate surface area is exposed to the laser irradiation.

Figure 4A:
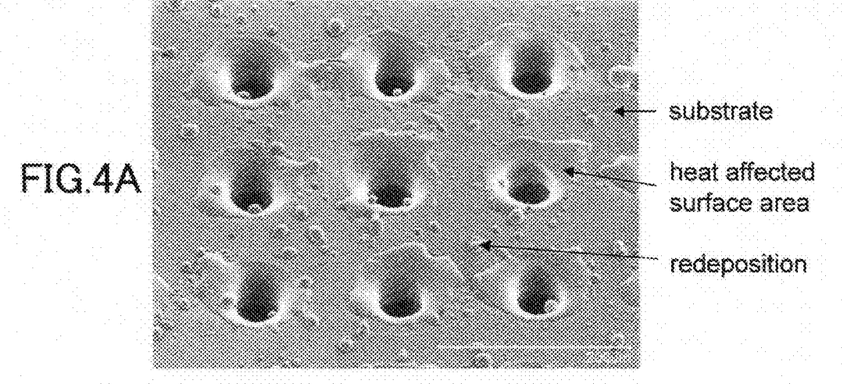
FIG. 4A to FIG. 4C are views illustrating shows SEM images of holes drilled in 170 μm thick glass, viewed from the side where the laser beam was applied.
Figure 4B:
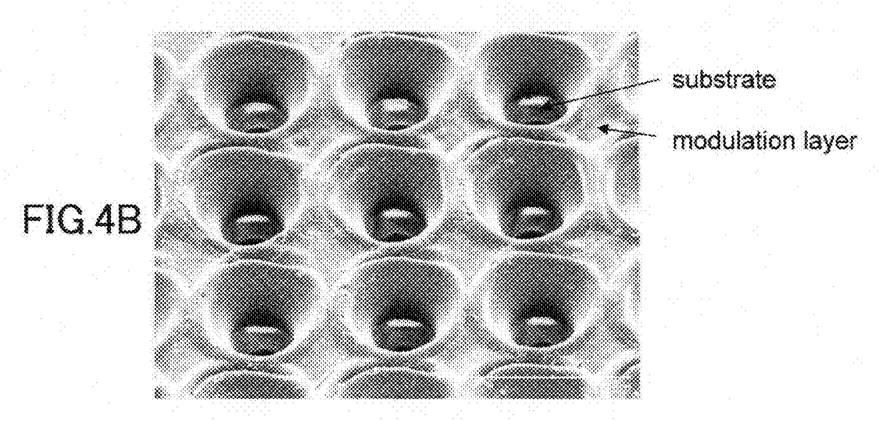
Figure 4C:
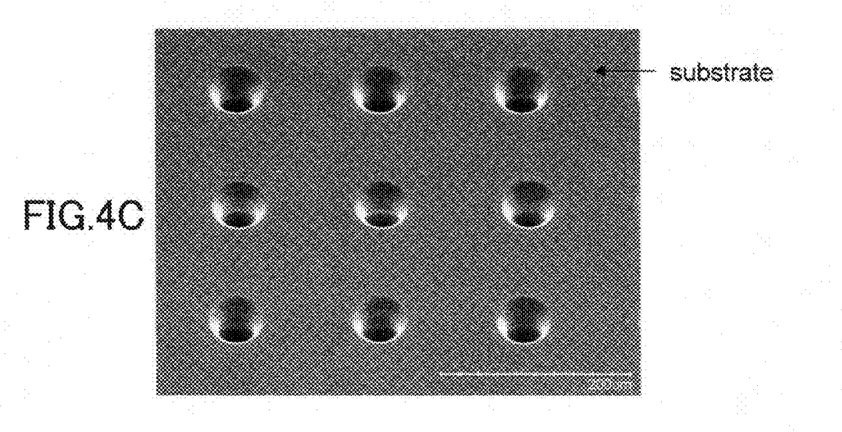

FIG. 4A to FIG. 4C are views illustrating shows SEM images of holes drilled in 170 μm thick glass, viewed from the side where the laser beam was applied.

In FIG. 4A, holes drilled without using a first or any modulation layer. Since the laset beam was larger than the holes drilled the surface around the holes is affected by the laser beam forming a molten surface layer or a crater. Ejected material is deposited around the holes. FIG. 4B shows the modulation layer, here a 100 μm thick adhesive PET foil, still attached to the substrate after holes were drilled. The diameter of the recess in the modulation layer decreases from top to bottom (comp. to FIG. 3A to FIG. 3C) thus exposing only a small surface area of the substrate to the laser beam. In FIG. 4C, the same array of holes as shown in FIG. 4B after the modulation layer was removed. The holes and surface around are clean and without deformations.

Figure 5A:
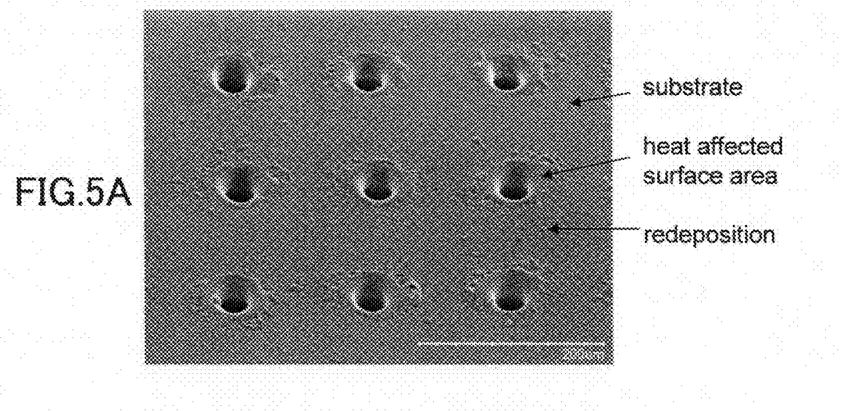
FIG. 5A to FIG. 5C are views illustrating SEM images of holes drilled in 170 μm thick glass, viewed from the side where no laser beam was applied.
Figure 5B:
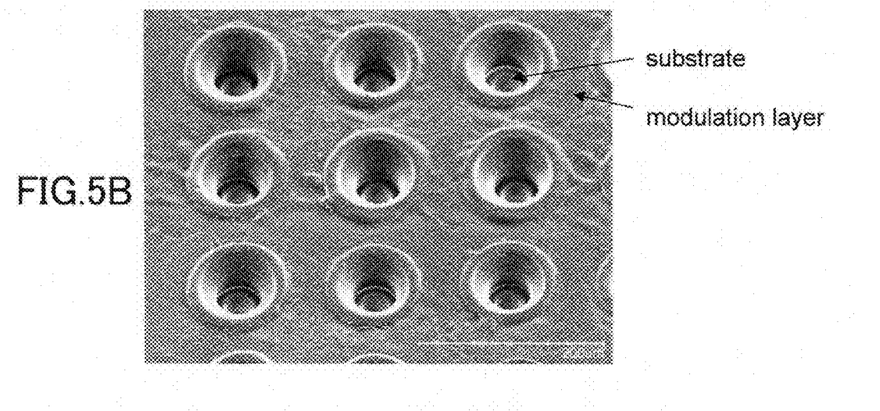
Figure 5C:
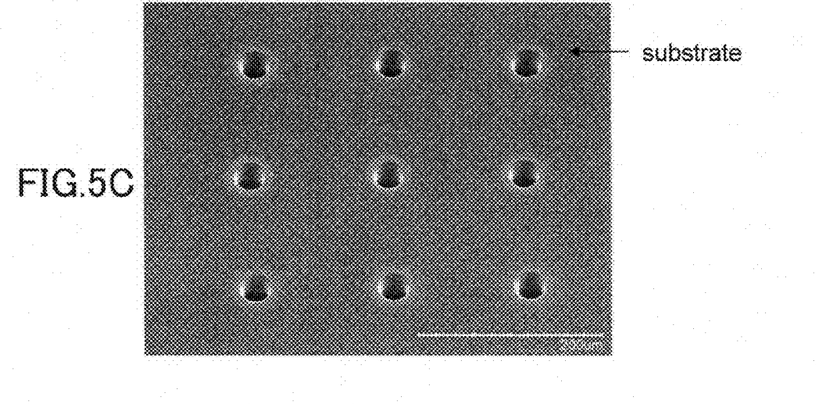

FIG. 5A to FIG. 5C are views illustrating SEM images of holes drilled in 170 μm thick glass, viewed from the side where no laser beam was applied. In FIG. 5A, holes drilled without using a second modulation layer, but with a first modulation layer on the opposite side (which is not shown). The side without modulation layer is shown. The area around the holes is molten and deformed by the heat created by the high frequency arc and the DC discharge arc for hole opening. FIG. 5B shows the result of an experiment with first and second modulation layer. The layer shown is the second modulation layer located on the side which is not exposed to the laser beam, here a 40 μm thick adhesive PET foil, which is still attached to the substrate after holes were drilled. In FIG. 5C, the same array of holes as in FIG. 5B after removing the modulation layer. The holes and surface around are clean and without deformations.

Figure 6A:
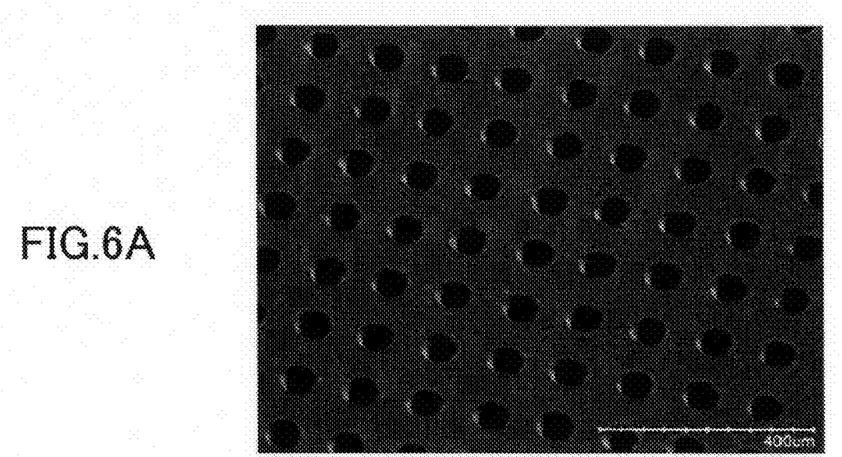
FIG. 6A and FIG. 6B are views illustrating SEM images of holes drilled in 170 μm thick glass using a modulation layer of 40 μm thick self-sticking Scotch® Magic Tape on either side.
Figure 6B:
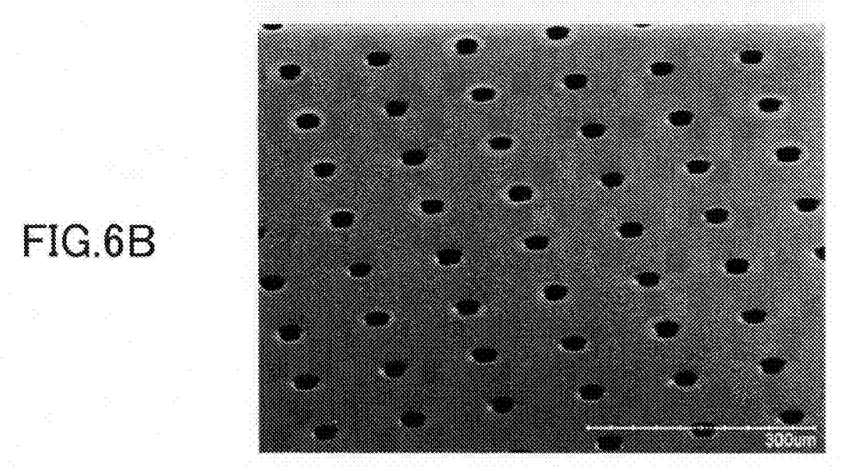

FIG. 6A and FIG. 6B are views illustrating SEM images of holes drilled in 170 μm thick glass using a modulation layer of 40 μm thick self-sticking Scotch® Magic Tape on either side.

Images were taken after the layer was removed. FIG. 6A shows the side where the laser was applied. FIG. 6B shows the ground side where no laser was applied.

Figure 7A:
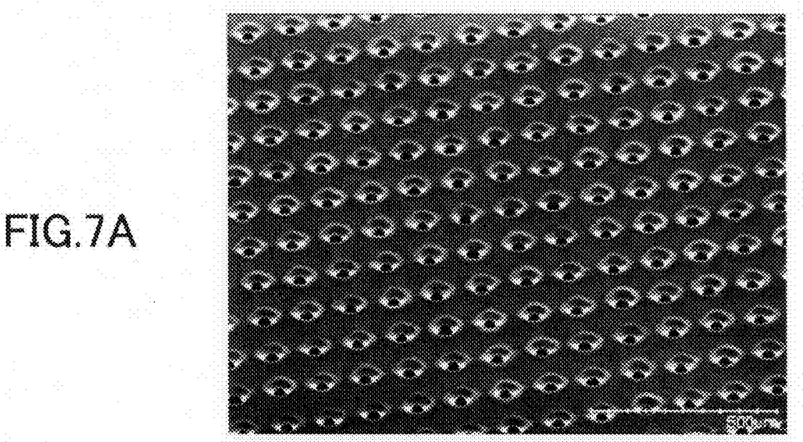
FIG. 7A and FIG. 7B are views illustrating the effect of different thicknesses of the first modulation layer.
Figure 7B:
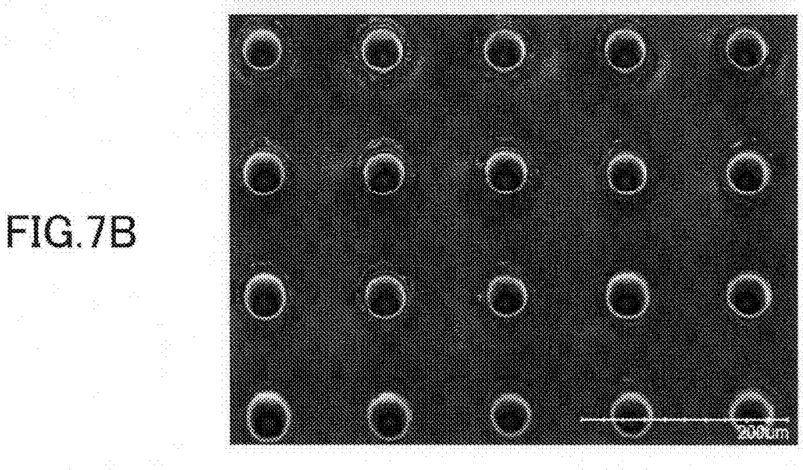

FIG. 7A and FIG. 7B are views illustrating the effect of different thicknesses of the first modulation layer. A non-adhesive PET foil was attached on both sides of the substrate using a thin film of water between the substrate and the modulation layer. Holes were drilled in 170 μm thick glass substrate. Images were taken after layer was removed. In FIG. 7A, a 40 μm thick PET foil was attached to the side where the laser was applied. There is no re-deposited material left between the holes but there is still a crater shape because the orifice created in the modulation layer and therefore the substrate surface area exposed to laser light was larger than the hole drilled. In FIG. 7B, using an 80 μm thick PET foil on the side where the laser was applied results in straighter holes without a crater shape at the entrance. The bright spot in the center of the holes is the metallic holder plate of the SEM on which the sample was placed to take images. This view through the holes also reveals a cylindrical hole shape and a clean inner surface.

Figure 8A:
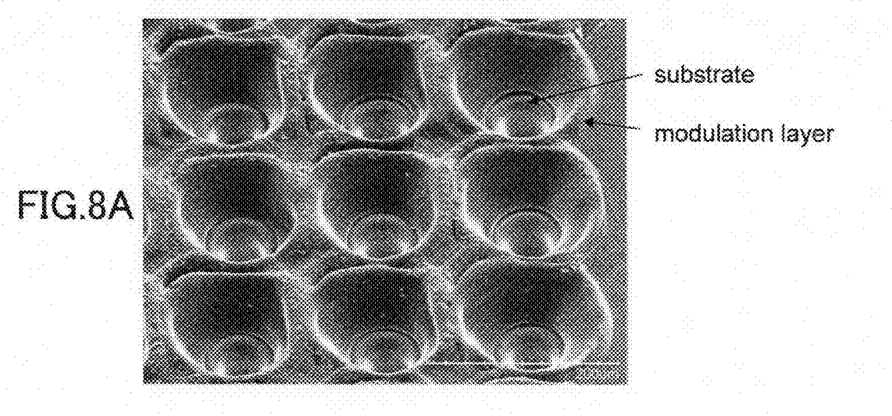
FIG. 8A and FIG. 8B are views illustrating the difference of the material properties of the first modulation layer on the side where the laser was applied.
Figure 8B:
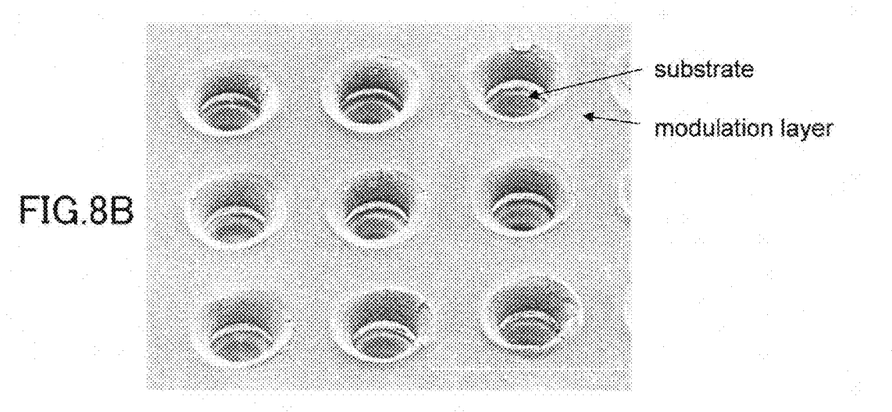

FIG. 8A and FIG. 8B are views illustrating the difference of the material properties of the first modulation layer on the side where the laser was applied. Images were taken with the modulation layer still attached to the substrate. In FIG. 8A, the modulation layer was a 40 μm thick adhesive PET foil. A considerable volume of layer material has been removed resulting in a conical shape of the recess created in the modulation layer. Due to conical shape, the substrate surface exposed depends on the thickness of the modulation layer as illustrated in FIG. 3A to FIG. 3C. In FIG. 8B, the modulation layer was a 40 μm thick polyimide (PI) foil. Process conditions were the same as in FIG. 8A. Thermal stability of PI is significantly higher compared to PET. E.g. the glass transition temperature of PI is around 400° C. (PET 70° C.), and it does not obey a melting point (melting temperature of PET is about 250° C.) but decomposes/vaporizes at temperatures significantly higher than the glass transition temperature. Due to the higher thermal stability the conditions are closer to those illustrated in FIG. 2 resulting in a recess which is smaller and more cylindrical as compared to FIG. 8A.

Further, the following embodiments will be included.

In one embodiment, the first modulation layer shields the substrate surface from heat which is due to the laser and/or to an AC arc, generated if an AC voltage is applied, and/or to a DC arc, generated by the application of a DC voltage (in step c). In one embodiment, the second modulation layer shields the substrate surface from heat which is due to an AC arc, generated if an AC voltage is applied, and/or to a DC arc, generated by the application of a DC voltage applied in step c).

In some embodiments, a focused laser beam is used on both sides of the substrates. In this case, also the second modulation layer shields the substrate surface from heat which is due to the laser beam irradiated on this side of the substrate.

In one embodiment, the first and second modulation layer are made of a material which has a transition between a solid and a liquid state, or a solid and a gaseous state, that occurs within a temperature range from room temperature to the melting temperature of the substrate, or that occurs at a defined amount of energy applied in step b) by using the focused laser beam.

In one embodiment, the laser beam, preferably the focused laser beam is irradiated onto the side where the first modulation layer is located. In another embodiment, two laser beams, preferably focused laser beams are irradiated on either side of the substrate.

In one embodiment, the first and second modulation layer are made of the same material or a different material.

In one embodiment, the first and second modulation layer are, independently at each occurrence, made of a material selected from the group comprising polymers, in particular polydimethylsiloxane (PDMS), polyimide (PI), polyethylene terephthalate (PET), ethylene propylene rubber, inorganic silicone rubber, PVC with synthetic acrylic adhesive.

In one embodiment, the first and second modulation layer, independently at each occurrence, have a thickness in the range of from 1 μm to 1 mm, preferably 10 μm to 500 μm, more preferably 15 μm to 300 μm, more preferably 20 μm to 200 μm, even more preferably 20 μm to 100 μm.

In one embodiment, the first modulation layer has a modulating region which is adjacent to and in contact with the substrate region in which substrate region the hole, recess or well is to be generated, wherein step b) is performed such that the modulation layer is molten and/or evaporated in the modulating region, thereby allowing access of the focused laser beam to the substrate region, and wherein during step c), the modulation layer is partially or entirely displaced in the modulating region, through the dissipation of the electrical energy.

In one embodiment, the first and second modulation layer are attached to the substrate in such a manner that they cover the substrate in step a) on opposite sides.

In one embodiment, the laser beam is a focused laser beam, in another embodiment an unfocused laser beam.

In one embodiment the first modulation layer is used to create during step b) and/or c) a mask on the substrate, which mask exposes only the region(s) of the substrate where a hole, recess or well is to be generated.

In one embodiment, the first and/or second modulation layer is used to define, modulate or restrict the surface area of the substrate which is exposed to the laser beam, preferably the focused laser beam in step b) and/or to the heat of the AC voltage in step b) and/or to the heat of the dissipating in step c).

In one embodiment, the first and second modulation layer are used to improve the flatness/surface quality of a region surrounding the hole, recess or well introduced, by absorbing material ejected during step c) into the modulation layer(s) and thus avoiding redeposition of the ejected material directly onto the substrate surface, wherein preferably, the absorbed material is subsequently removed together with the modulation layer, after generation of the hole, recess or well in the substrate.

In one embodiment, step b) is performed by directly heating the modulation layer through absorption of laser radiation of a wavelength of the laser beam, preferably the focused laser beam, absorbed by the modulation layer.

In one embodiment, steps a)-c) are performed once, such that a first hole, recess or well is generated in a first substrate region, thereafter the substrate is moved by a defined distance relative to the electrodes and laser beam, and steps b)-c) are performed a second time such that a second structure is generated in a second substrate region.

In one embodiment, steps b)-c) are performed n times, such that an array of n structures is generated in the substrate, n being an integer >1.

In one embodiment, the electrical energy applied in step c) is sufficient to generate a through hole or through channel in the substrate.

The term "modulation layer" as used herein, is meant to refer to a layer that provides for a mask which defines the size, preferably the cross-section, of the region where a hole, recess or well is to be generated. In a preferred embodiment, the first modulation layer acts as a mask which is generated in-situ during the performance of the method, preferably during step b) and/or c), on the substrate which mask exposes only the region(s) of the substrate where a hole, recess or well is to be generated. Before the method according to the present invention is performed, there is no mask and the modulation layer has a closed surface. When step b) and/or c) is performed, a mask is generated from the modulation layer. Typically, the first modulation layer is located on the side of the substrate, where the heat is applied in step b). The first modulation layer also allows to avoid surface contamination and/or redeposition of molten substrate material. Moreover, in one embodiment, the second modulation layer is located on the opposite side of the substrate, i.e. distant from the side where the heat is applied in step b). The second modulation layer allows to avoid surface contamination and/or redeposition of molten substrate material. Without wishing to be bound by any theory, the inventors believe that the function of the modulation layer(s), in particular the second modulation layer is that material that is ejected from the substrate cannot come to rest and stick to the substrate surface but is deposited on the layer or incorporated therein. Alternatively, the presence of the modulation layer(s) changes the way that the material is being ejected from the substrate such that no filaments are formed that would stick to the entrance of the hole after the hole has been generated. All this ejected substrate material can be removed together with the modulation layer when the modulation layer(s) is (are) removed after the generation of hole, to provide for a clean substrate surface that has hitherto no been achieved.

In one embodiment, the user-defined magnitude of voltage is in a range of 10V to $10^6$V, preferably from $10^2$V to $3 \times 10^5$ V, more preferably from $10^3$ V to $30 \times 10^3$ V and most preferably from $2 \times 10^3$ V to $15 \times 10^3$ V.

In one embodiment, the impedance of the voltage supply is an impedance >1 Ohm, preferably >10 kOhm, more preferably >100 k Ohm, and, even more preferably >1 MOhm.

In one embodiment, the impedance is in the range from 1 Ohm to 1 GOhm, wherein, preferably, the impedance is variable within the range during performance of the method.

In one embodiment, the electrically insulating or semiconducting substrate is made of a material selected from a group comprising, silicon-based substrates, such as glass, quartz, silicon nitride, silicon oxide, semiconducting materials such as elemental silicon, including doped silicon and crystalline silicon, germanium, compound semiconductors, such as gallium arsenide, indium phosphide, as well as aluminium based crystalline materials such as alumina, spinel, sapphire, as well as ceramics such as zirconia.

In one embodiment, the substrate is electrically insulating at room temperature and is preferably made of a substrate material selected from glass, quartz, diamond, alumina, sapphire, aluminium nitride, zirconia, ceramics, and spinel, more preferably quartz, glass and ceramics as e.g. low temperature co-fired ceramics (LTCC), wherein, preferably, the substrate has an electrical resistivity >$10^9$ Ohm cm at room temperature.

In one embodiment, the substrate is electrically semiconducting at room temperature and is preferably made of a substrate material selected from elemental silicon, including doped silicon and crystalline silicon, germanium, compound semiconductors such as gallium arsenide and indium phosphide. Preferably, the substrate has an electrical resistivity $10^9$ Ohm cm at room temperature.

In one embodiment, step b) is performed using a laser, preferably having a wavelength in a wavelength range which is at least partially absorbed by the substrate materials and/or the modulation layer.

Although a preferred embodiment of the method of generating a hole and the device for performing the method has been specifically illustrated and described, it is to be understood that minor modifications may be made therein without departing from the spirit and scope of the invention as defined by the claims.

The present invention is not limited to the specifically disclosed embodiments, and numerous variations and modifications and modifications may be made without departing from the spirit and scope of the present invention.

What is claimed is:

1. A method of generating a hole, recess or well in a substrate, comprising:
    providing a substrate which is electrically insulating or semiconducting at room temperature and which has a first modulation layer on a first surface of the substrate and a second modulation layer on a second surface of the substrate such that the first and second modulation layers are in contact with a substrate region where the hole, recess or well is to be generated in the substrate;
    applying a focused laser beam having a spot size on the first modulation layer such that the first modulation layer is heated, that an opening smaller than the spot size is formed in the first modulation layer, that by exposing the substrate region directly to the focused laser beam through the opening, at least part of substrate material in the substrate region is molten, while the modulation layer and the opening modulate a heat profile generated by the focused laser beam such that an amount of heat reaching the substrate outside the substrate region is restricted; and
    applying to the substrate region of the substrate a DC electrical voltage sufficient to cause a dielectric breakdown across the substrate region such that the substrate material is ejected from the substrate and that the hole, recess or well is generated in the substrate region of the substrate, wherein the opening has a size defined by heat from the focused laser beam and at least one of a transformation/decomposition threshold of material of the first modulation layer and a thickness of the first modulation layer, and the opening is formed in the first modulation layer and the part of the substrate material is molten before the applying of the DC electrical voltage, and wherein each of the first and second modulation layers is made of a different material from each other.

2. The method according to claim 1, wherein an electrical energy is dissipated from the substrate when the substrate material is ejected.

3. The method according to claim 1, wherein the first modulation layer avoids a contamination of the first surface and/or a redeposition of the ejected substrate material on the first surface, and shields the first surface from heat, and the second modulation layer avoids a contamination of the second surface and/or a redeposition of the ejected substrate material on the second surface, and shields the second surface from heat.

4. The method according to claim 1, wherein each of the first and second modulation layers is made of a material which has a transition between a solid state and a liquid state, or a solid state and a gaseous state, that occurs within a temperature range from room temperature to a melting temperature of the substrate, or that occurs at a certain amount of energy applied by the focused laser beam.

5. The method according to claim 1, wherein each of the first and second modulation layers is made of a polymer material.

6. The method according to claim 5, wherein the polymer material is at least one of polydimethylsiloxane, polyimide, polyethyleneterephthalate, ethylene propylene rubber, inorganic silicone rubber, or polyvinyl chloride comprising synthetic acrylic adhesive.

7. The method according to claim 1, wherein each of the first and second modulation layers has a thickness in the range of 20 µm to 100 µm.

8. The method according to claim 1, wherein the first and second modulation layers are attached to the substrate such that the first and second modulation layers cover both of the first and second surfaces of the substrate.

9. The method according to claim 1, wherein the first modulation layer works as a mask on the substrate such that the mask covers the substrate other than the substrate region during the melting of the part of the substrate material and/or during the applying of the DC electrical voltage.

10. The method according to claim 1, wherein the first and second modulation layers improve a flatness and/or a surface quality of a region surrounding the hole, recess or well, by absorbing the ejected substrate material into at least one of the first and second modulation layers and avoiding a redeposition of the ejected substrate material onto the first and the second surfaces of the substrate.

11. The method according to claim 10, wherein the absorbed material is subsequently removed together with the first and second modulation layers, after the hole, recess or well is generated in the substrate.

12. The method according to claim 1, wherein an electrical energy applied in the applying of the DC electrical voltage is sufficient to generate a through hole or through channel in the substrate.

13. The method according to claim 1, wherein in the melting of the part of the substrate material, an AC voltage is applied to the substrate.

14. The method according to claim 1, further comprising:
changing the relative position between the substrate and the focused laser beam after the hole, recess or well is generated in the substrate region of the substrate; and
repeating the applying of the focused laser beam, the applying of the DC electrical voltage, and the changing of the relative position between the substrate and the focused laser beam, such that an array of the holes, recesses or wells is generated in the substrate.

* * * * *